US011410913B2

(12) United States Patent
Hussain et al.

(10) Patent No.: US 11,410,913 B2
(45) Date of Patent: Aug. 9, 2022

(54) MULTI-LAYER DIE ATTACHMENT

(71) Applicant: TEXAS INSTRUMENTS INCORPORATED, Dallas, TX (US)

(72) Inventors: Mohammad Waseem Hussain, Irving, TX (US); Steven Murphy, Richardson, TX (US); Leslie E. Stark, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/822,329

(22) Filed: Mar. 18, 2020

(65) Prior Publication Data

US 2020/0219798 A1 Jul. 9, 2020

Related U.S. Application Data

(62) Division of application No. 15/899,114, filed on Feb. 19, 2018, now Pat. No. 10,636,727.

(51) Int. Cl.
*H01L 23/49* (2006.01)
*H01L 23/00* (2006.01)
*H01L 23/31* (2006.01)
*H05K 1/18* (2006.01)
*H01L 23/495* (2006.01)

(52) U.S. Cl.
CPC .......... *H01L 23/49* (2013.01); *H01L 23/3114* (2013.01); *H01L 23/3121* (2013.01); *H01L 23/4951* (2013.01); *H01L 23/49506* (2013.01); *H01L 23/49513* (2013.01); *H01L 23/49548* (2013.01); *H01L 23/49575* (2013.01); *H01L 24/46* (2013.01); *H05K 1/181* (2013.01)

(58) Field of Classification Search
CPC combination set(s) only.
See application file for complete search history.

(56) References Cited

U.S. PATENT DOCUMENTS 6,399,426 B1 * 6/2002 Capote .................. H01L 24/29
438/126
2002/0164838 A1 11/2002 Moon et al.
2017/0256515 A1 9/2017 Strutz et al.

* cited by examiner

*Primary Examiner* — Hrayr A Sayadian
(74) *Attorney, Agent, or Firm* — Dawn Jos; Charles A. Brill; Frank D. Cimino (57) ABSTRACT

A packaged electrical device that includes a cured adhesive layer and a cured layer of die attach material coupled between a semiconductor die and a substrate. The packaged electrical device may also include wire bonds coupled between the substrate and leads of the semiconductor die. In addition, the packaged electrical device may be encapsulated in molding compound. A method for fabricating a packaged electrical device. The method includes printing a layer of die attach material over a semiconductor wafer and applying a layer of 2-in-1 die attach film over the layer of die attach material. The method also includes singulating the semiconductor wafer to create a semiconductor die and placing the semiconductor die onto a substrate. In addition the method includes wire bonding the substrate to leads of the semiconductor die and encapsulating the device in molding compound.

8 Claims, 10 Drawing Sheets

MULTI-LAYER DIE ATTACHMENT

CROSS REFERENCE TO RELATED APPLICATION

This Application is a divisional of and claims the benefit to U.S. patent application Ser. No. 15/099,114 filed Feb. 19, 2018, the contents of which is herein incorporated by reference.

BACKGROUND OF THE INVENTION

This invention relates to the packaging of a semiconductor die.

DETAILED DESCRIPTION OF THE INVENTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
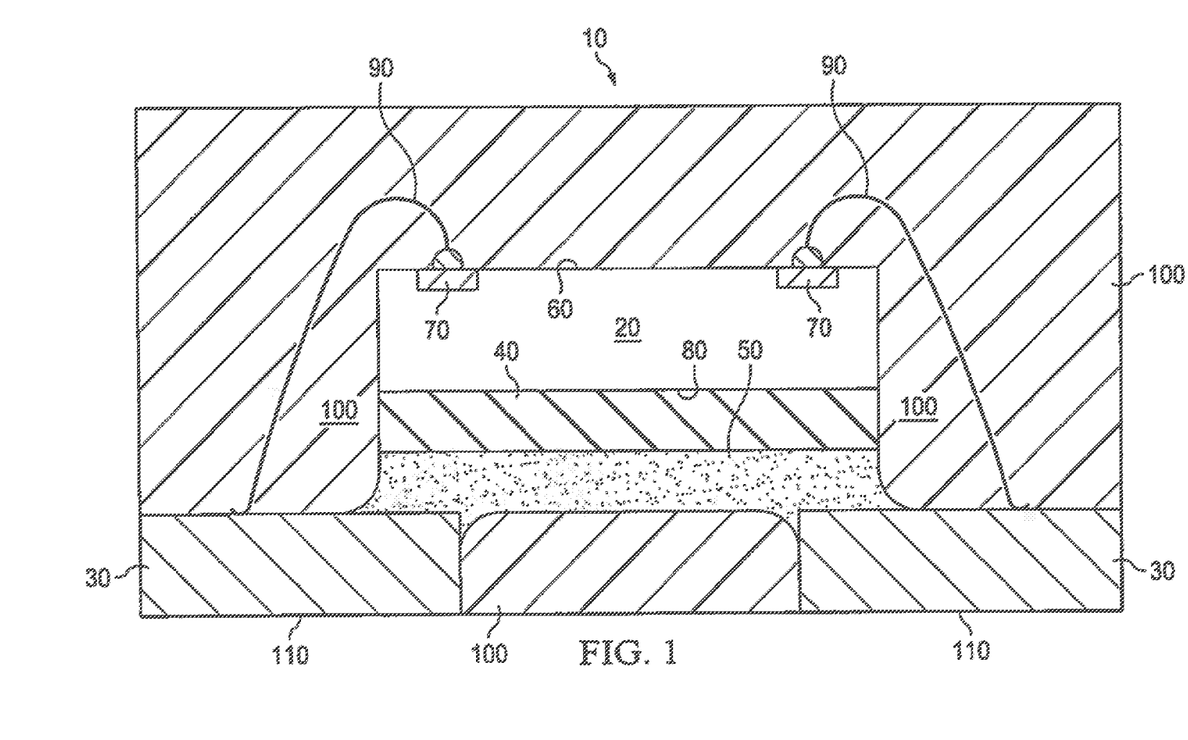
FIG. 1 is a cross-sectional view of a packaged device having a multi-layered die attachment in accordance with the present invention.

Referring to the drawings, FIG. 1 is a cross-sectional view of a packaged electrical device 10 in accordance with the present invention. In this example, a singulated semiconductor die 20 is secured to a substrate 30 with a layer of die attach material 40 that was applied using a printing technique plus an adhesive layer 50 that was applied using a lamination technique. A front side 60 of the semiconductor die 20 includes electrical leads 70. The semiconductor die has a back side 80 that is opposite to the front side 60. The layer of die attach material 40 and the adhesive layer 50 are insulative; therefore, the semiconductor die 20 is positioned with its electrical leads 70 facing away from the adhesive layer 50.

The substrate 30 of FIG. 1 is a leadframe. The leadframe may be comprised of copper or it may be comprised of a different suitable material such as copper that is plated with an electrically conductive metal (possibly nickel or gold). The semiconductor die 20 may be electrically connected to the substrate 30 with wire bonds 90.

Molding compound 100 encapsulates the semiconductor die 20, the die attach material 40, the adhesive layer 50, the wire bonds 90, and a portion of substrate 30. A surface 110 of substrate 30 is left unencapsulated so that the semiconductor die 20 can be electrically connected to other electrical devices (not shown) through substrate 30.

The semiconductor die 20 may be any structure, such as Quad Flat No-Lead (QFN), Dual Flat No-Lead (DFN), or Small Outline-Transistor (SOT), that needs isolation. For example, the semiconductor die may be configured as a Chip-On-Lead structure (as shown in FIG. 1). However, the semiconductor die 20 may have other configurations where the die sits on a lead rather than a thermal pad.

Figure 2:
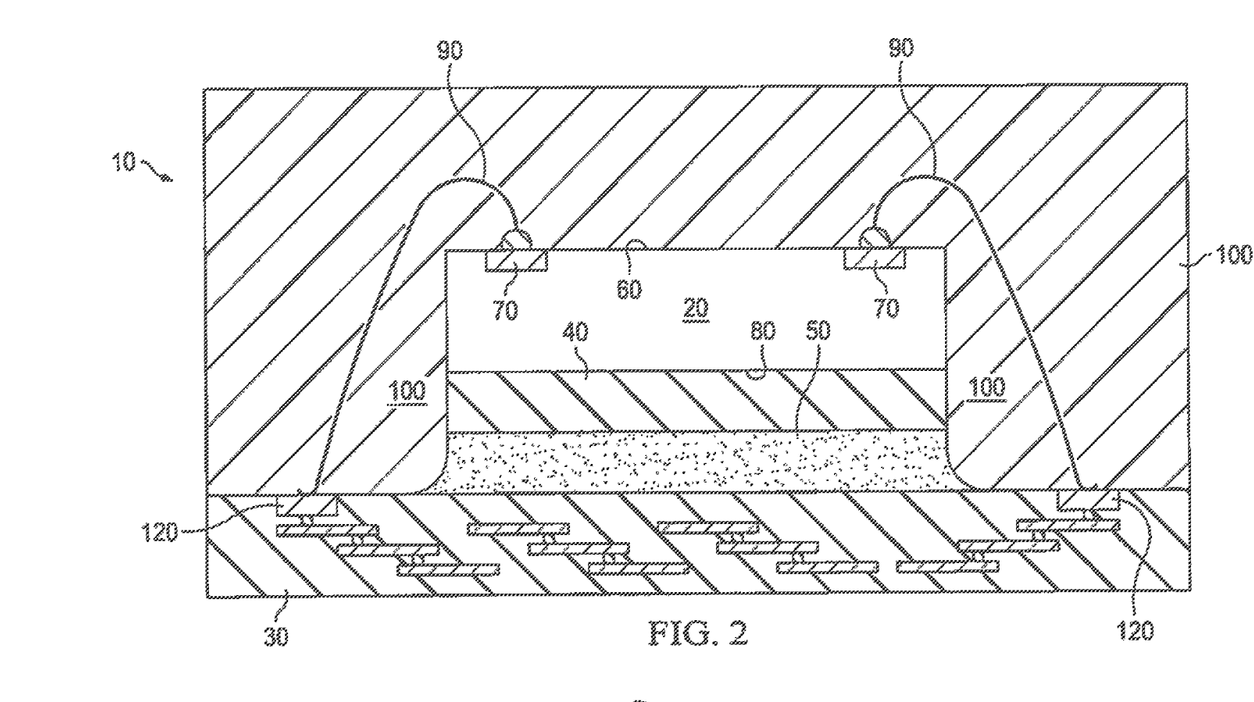
FIG. 2 is alternative cross-sectional view of a packaged device having a multi-layered die attachment in accordance with the present invention.

An alternative embodiment to FIG. 1 is shown in FIG. 2. Specifically, in this alternative embodiment the substrate 30 is a multi-layered solder resist printed circuit board ("PCB"). The solder resist printed circuit board 30 contains multiple layers of electrical traces and routing (not shown). The semiconductor die 20 is again electrically connected to the solder resist printed circuit board 30 by wire bonds 90 that are connected between the leads 70 of the semiconductor substrate 20 and electrical pads 120 of the solder resist printed circuit board 30. The layers of electrical traces contained in the solder resist printed circuit board 30 may electrically couple the semiconductor die 20 to other electrical devices (not shown).

Figure 3:
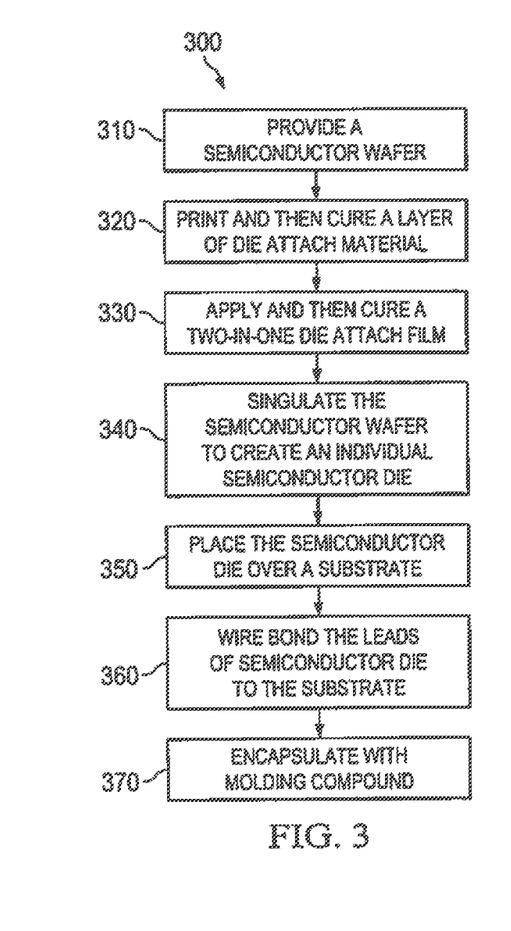
FIG. 3 is a method for fabricating the packaged device of FIGS. 1 and 2.

FIG. 3 shows an example method 300 for fabricating the packaged electrical device 10 of FIGS. 1 and 2. FIGS. 4-9 illustrate the steps of the method 300 shown in FIG. 3. The following example method is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

Figure 4:
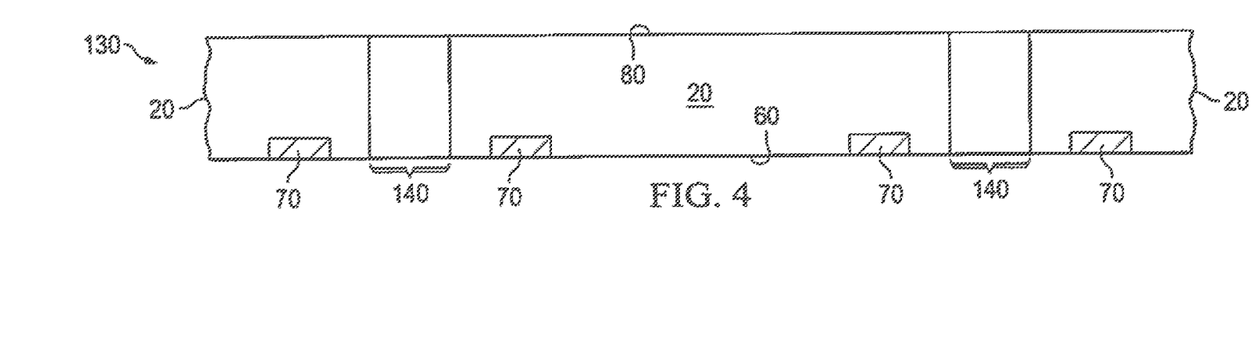
FIGS. 4-9 are cross-sectional diagrams of selected steps of the method of FIG.

Step 310 is the provision of a fully processed semiconductor wafer 130, as shown in FIG. 4. The semiconductor wafer 130 contains numerous completed semiconductor die 20. The semiconductor dies may contain any combination of active and passive devices, such as CMOS, BiCMOS and bipolar junction transistors—as well as capacitors, optoelectronic devices, inductors, resistors, and diodes.

The semiconductor dies 20 are spaced apart from each other on the semiconductor wafer 130 by zones 140 of unprocessed semiconductor material. These zones 140 of unprocessed semiconductor material are mostly destroyed by a rotating saw blade during the singulation process (as explained infra). Therefore, the zones 140 of unprocessed semiconductor material are often called "saw streets" because they form a grid between all of the semiconductor dies 20 on the semiconductor wafer 130 that is largely destroyed by the saw during the singulation process. The semiconductor wafer 130 has a front side 60 that includes the leads 70 of the semiconductor die 20. In addition, the semiconductor wafer 130 has a back side 80 that is opposite to the front side 60.

Figure 5:
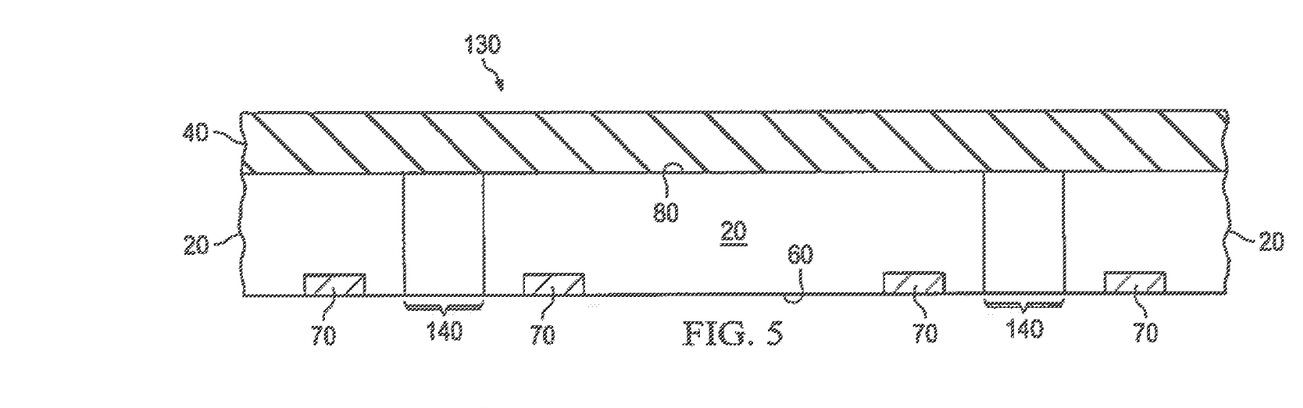

Step 320 is the formation of a layer of die attach material 40 over the back side 80 of the semiconductor wafer 130, as shown in FIG. 5. As an example, the die attach material 40 may be 8006N that is supplied by Henkel. The layer of die attach material 40 is applied to the back side 80 of the semiconductor wafer 130 using a printing process (such as screen printing). When printed, the die attach material 40 is in liquid form and it is usually thickened with fillers in order to better control the placement of the liquid material onto the back side 80 of the semiconductor wafer 130. (The fillers also act as a flame retardant and reduce the cost of die attach material 40.) Next, the semiconductor wafer 130 is moved to an oven and it is subjected to a baking process for many hours. This "curing" process hardens the layer of die attach material 40.

Figure 6:
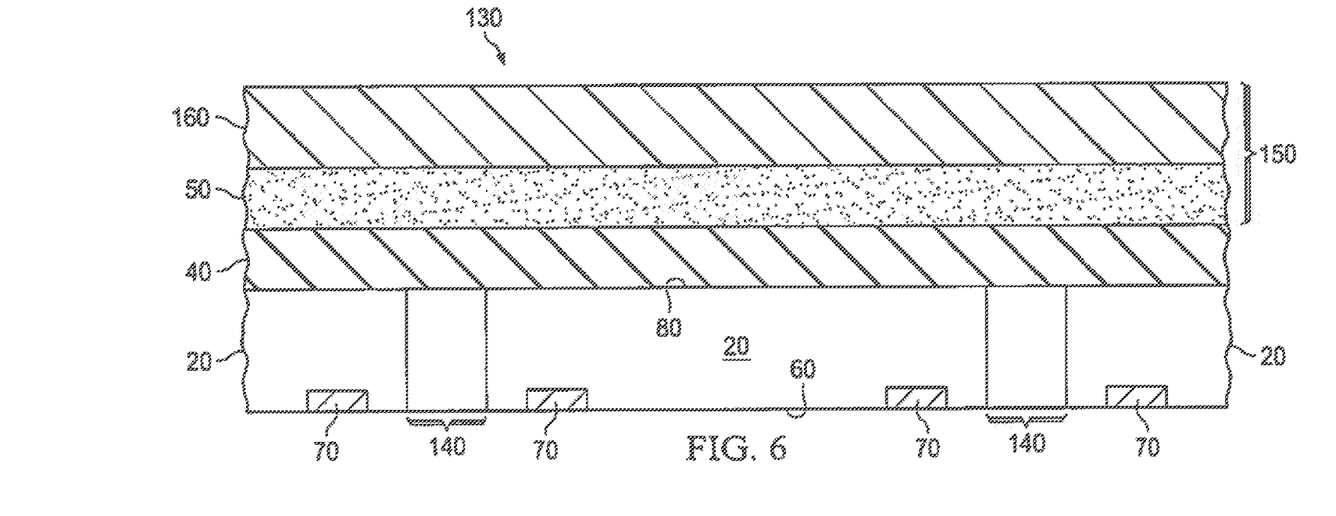

In accordance with this example embodiment, step 330 is the lamination of 2-in-1 die attach film 150 over the layer of printed and cured die attach material 40. As shown in FIG. 6, the 2-in-1 die attach film 150 is comprised of a spongy saw tape release film 160 and an adhesive layer 50 that is used for die attachment. Because the application of the 2-in-1 die attach film 150 is easy to control, the adhesive layer 50 is essentially free of filler material. More specifically, the 2-in-1 die attach film 150 is defined as essentially free of filler material because the filler material is a maximum of about 2 μm (compared to a maximum of about 30 μm for printed die attach materials). Furthermore, the use of 2-in-1 die attach film 150 may reduce manufacturing costs because it is used as both a saw tape and an adhesive.

Next, the semiconductor wafer 130 may undergo an optional electromagnetic radiation process that is often implemented with ultraviolet light. If used, the in-line radiation treatment of the semiconductor wafer 130 will cure the 2-in-1 die attach film 150. (Note that the semiconductor wafer 130 is not transported to a different machine for this curing process. Therefore, cost savings may be realized.)

Figure 7:
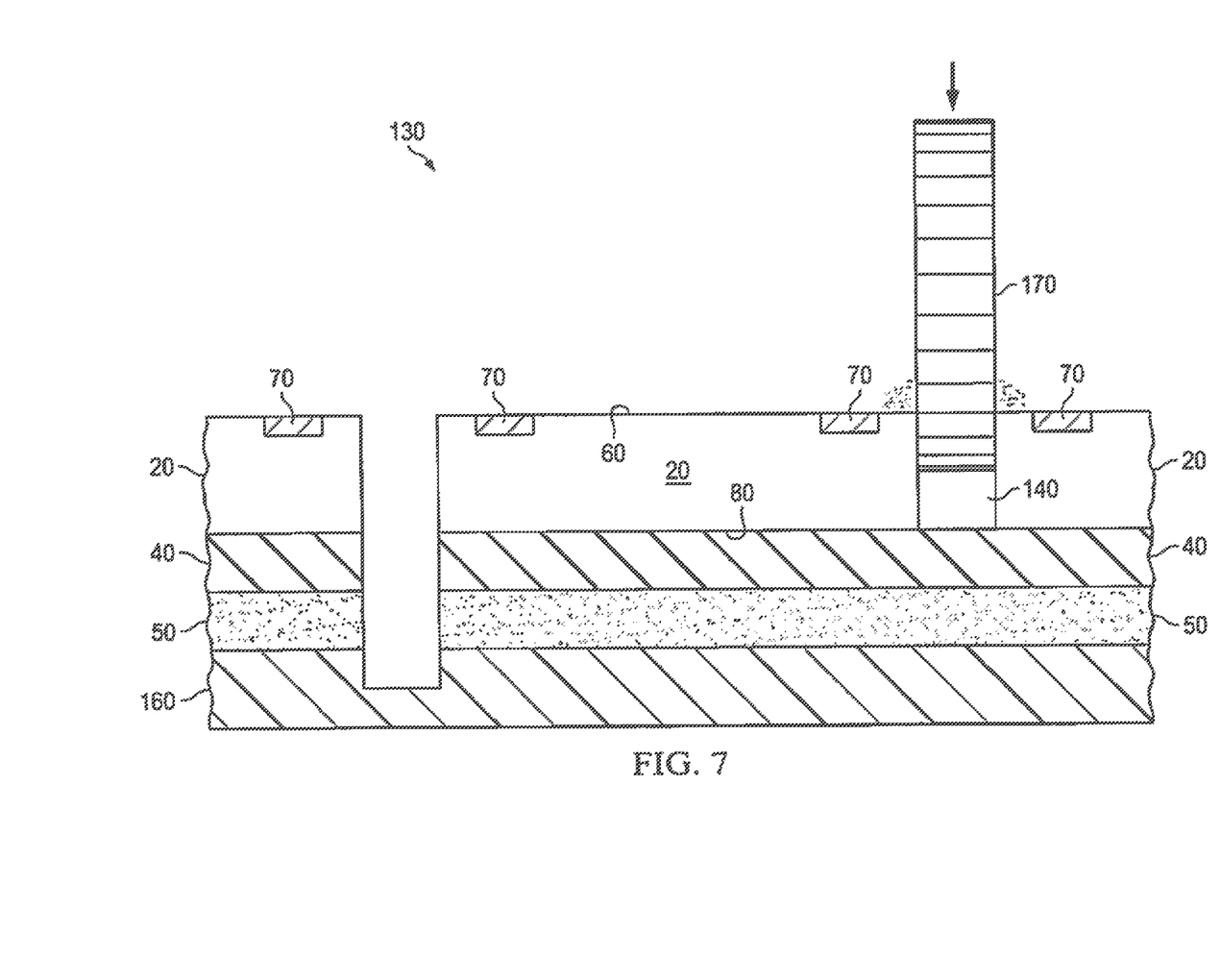

The semiconductor wafer 130 is singulated in step 340, as shown in FIG. 7. Typically a rotating saw blade 170 cuts through the saw street zones 140, the die attach material 40, the adhesive layer 50, and partially into the release film 160. This singulation process creates individual semiconductor dies 20 that can be separated from the release film 160 and relocated as desired (as explained more fully in the next process step).

Figure 8:
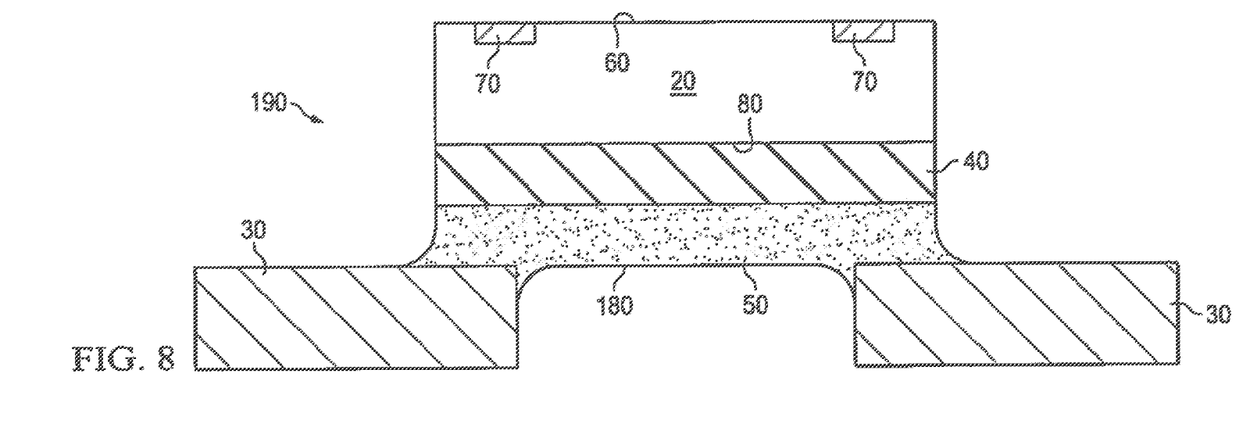

A shown in FIG. 8, the next step 350 is the placement of the semiconductor die 20 and the multi-layer die attachment, consisting of printed die attached material 40 and the laminated adhesive layer 50, onto a substrate 30. (As noted supra, the substrate 30 may be a solder resist printed circuit board (shown in FIG. 2) or a leadframe as shown in FIGS. 1 and 8.) Typically a robotic pick-and-place machine is used to separate the semiconductor die 20 plus the multi-layer die attachment 40, 50 from the release film 160. Then the back side 180 of adhesive layer 50 is pieced in contact with the substrate 30. In addition, pressure is often applied to the front side 60 of the semiconductor die 20 to push the adhesive layer 50 firmly onto the substrate 30 (which may create filets along the edges of adhesive layer 50, as shown in FIG. 8). At this point in the manufacturing process, a device having a multi-layer die attach film has been created and attached to a substrate 30. Thus, a portion 190 of the packaged electrical device 10 has been completed.

Figure 9:
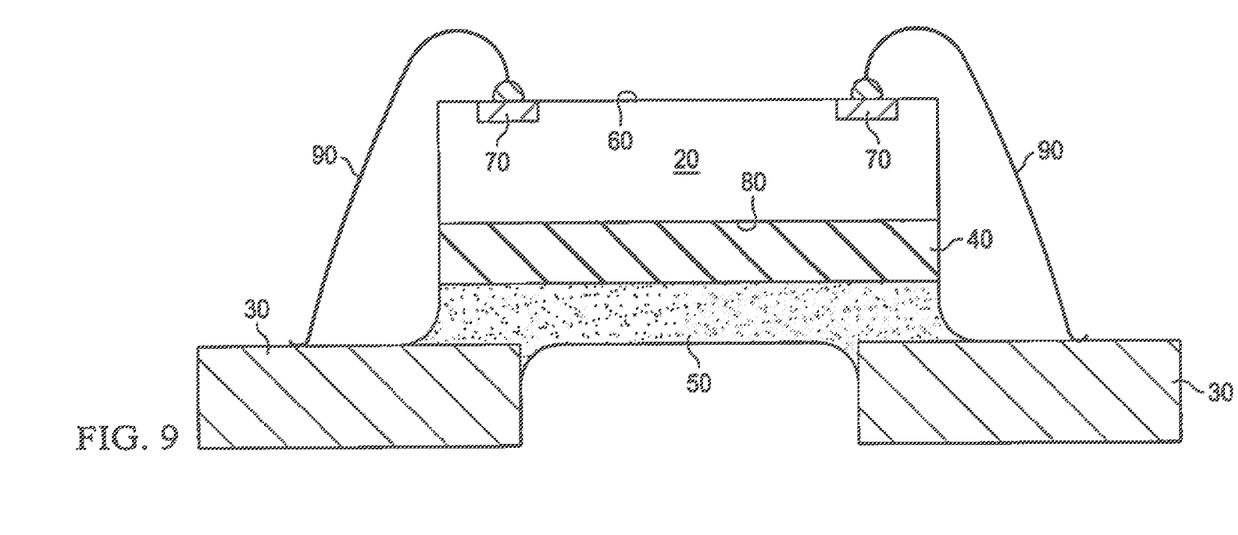

In step 360 a wire bonding process is used to form wire bonds 90 between the leads 70 of the semiconductor die 20 and the substrate 30, as shown in FIG. 9. The wire bonds 90 may be comprised of copper and they provide an electrical connection between the leads 70 that are located on the front surface 60 of the semiconductor die 20 and the substrate 30.

The final step 370 of the example method 300 for fabricating the packaged electrical device 10 of FIGS. 1 and 2 is the encapsulation of the semiconductor die 20, the die attach material 40, the adhesive layer 50, the wire bonds 90, and a portion of substrate 30 with molding compound 100. As mentioned supra and as shown in FIGS. 1 and 2, the surface 110 of substrate 30 is usually left unencapsulated so that the semiconductor die 20 can be electrically connected to other electrical devices (not shown) through substrate 30.

The example packaged electrical device 10 and the example fabrication process 300 may provide cost savings. In conventional packaging processes, two layers of printed die attach material (such as printed die attach material 40) are placed between the semiconductor die and the substrate 30. In addition, a layer of saw tape is placed over the second layer of printed die attach film to facilitate the singulation process. Therefore, the use of the 2-in-1 die attach film instead of the second layer of printed die attach material saves the production time, employee costs, machine usage, and material costs of printing the second die attach layer, attaching a layer of saw tape, and moving the semiconductor wafer to an oven to perform the cure process that takes many hours. It has been estimated the use of the 2-in-1 die attach film 150 instead of a second layer of printed die attach material results in a cost savings of $0.001 (U.S.) per packaged electrical device 10. (Note that the packaged electrical device 10 in this example measures around 1 mm square.) This cost savings can be substantial for volume (high runner) products.

Furthermore, the example packaged electrical device 10 and the example fabrication process 300 may improve quality and manufacturing yield. The conventional use of two layers of printed die attach material between the semiconductor die and the substrate 30 caused packaged electrical devices to often fail the pre-conditioning and testing process due to contamination. Specifically, contamination such as human debris, silicon debris from the saw street zones, abnormally large filler particles within one or both layers of printed die attach material, and voids created during the printing of liquid die attach material created electrical failures. Conversely, the adhesive layer 50 of the laminated 2-in-1 die attach film 150 is essentially free of filler (probably because filler is not needed to make the adhesive layer 50 more viscous and therefore more controllable during the application process). The release film 160 of the 2-in-1 attach film 150 facilitates the lamination process described supra that uses less machine time than the printing process. Moreover, voids and debris are contained/controlled because the cured first layer of printed die attach material 40 described supra acts to trap contaminants within the printed die attach material 40. Therefore, manufacturing yield is improved because the printed die attach material 40 and the essentially filler free adhesive layer 50 of the example structure and method nearly prevents contaminants (and voids) from reaching between the semiconductor die and the substrate (rendering the packaged electrical device 10 unusable).

Figure 10:
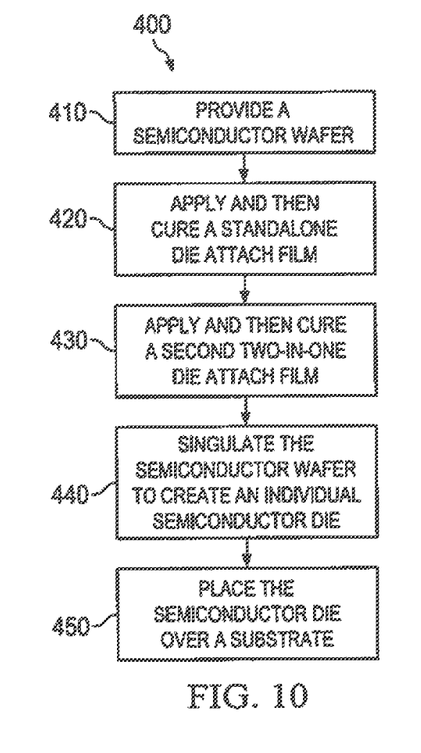
FIG. 10 is an alternative method for fabricating a packaged electronic device in accordance with the present invention.
Figure 11:
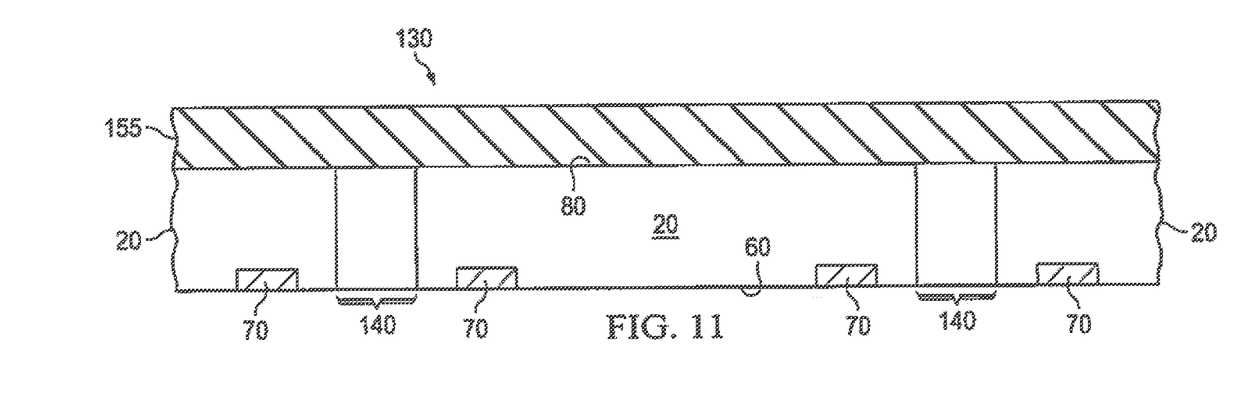
FIGS. 11-13 are cross-sectional diagrams of selected steps of the method of FIG. 10.

Referring again to the drawings, FIG. 10 shows an alternative method 400 for fabricating the partially completed packaged device 190. Structures that are similar to the structures shown in FIGS. 1-9 will have the same element number, FIGS. 11-13 are cross-sectional views of selected steps discussed in method 400.

Alternative method 400 begins with step 410, which is providing a fully processed semiconductor wafer, as shown in FIG. 4 and described supra. Next, step 420 is applying a layer of standalone die attach film 155, as shown in FIG. 11. It may be best to it a harder curing process (such as an oven cure) than the process described in step 330 in order to improve the likelihood that this layer will serve as a contamination barrier.

Figure 12:
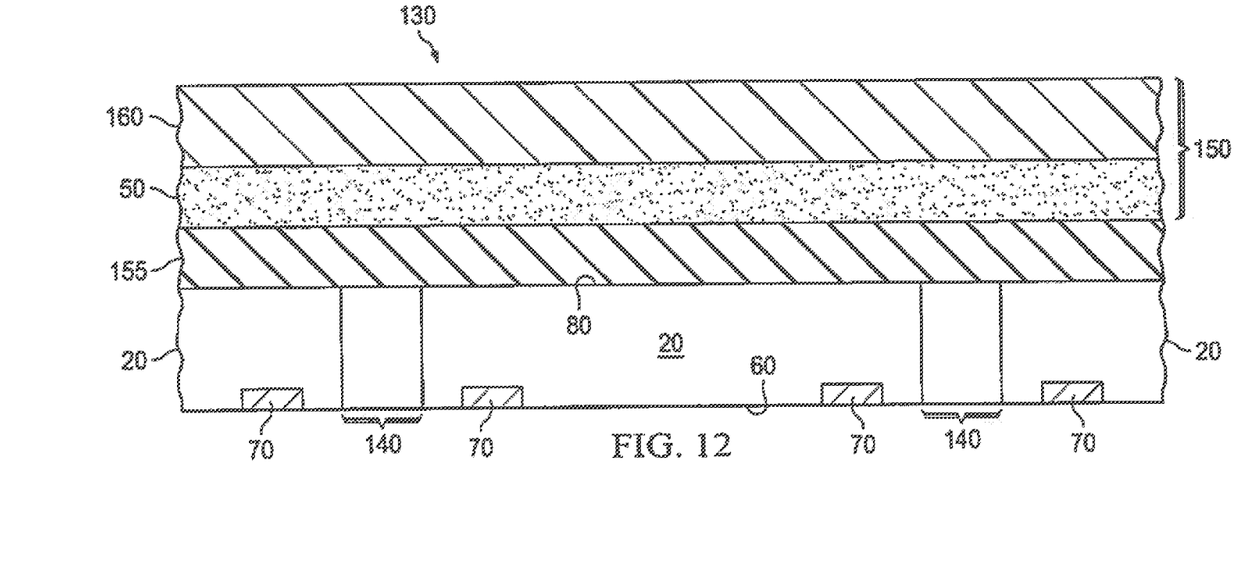
Figure 13:
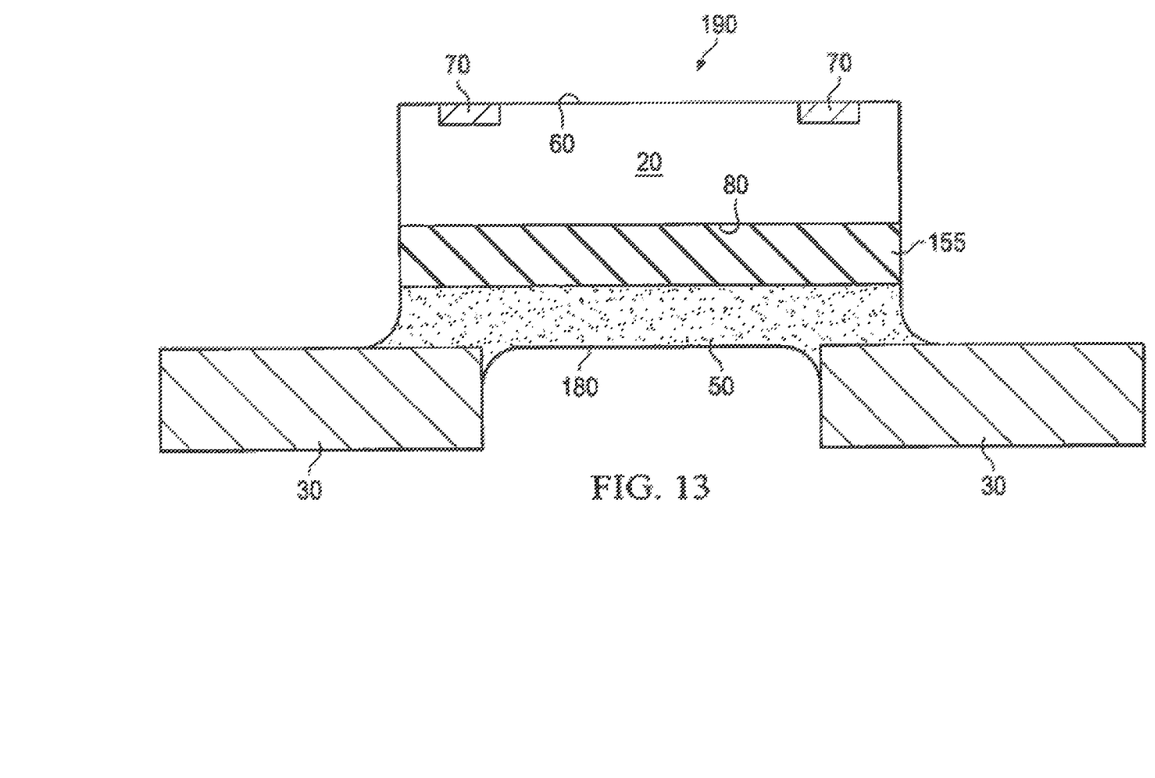

In step 430, shown in FIG. 12, a layer of 2-in-1 die attach film 150 is applied over the standalone the attach film 155. In this step, the optional electromagnetic radiation of semiconductor wafer 130 will be similar to the curing process described in step 330.

The next step, 440, is the singulation of the semiconductor wafer 130 to create individual semiconductor dies 20 (as described in step 340). Then, in step 450, a robotic pick-and-place machine may be used to separate the semiconductor die 20, the standalone die attachment film 155, and the adhesive layer 50 (belonging to the layer of 2-in-1 die attachment film 150) from the release film 160 of the 2-in-1 die attach film 150. The back side 180 of the adhesive layer 50 of the 2-in-1 die attach film is placed in contact with the substrate 30. In addition, pressure is often applied to the front side 60 of the semiconductor die 20 to push the adhesive layer 50 firmly onto the substrate 30 (which may create filets along the edges of adhesive layer 50, as shown in FIG. 13). As noted above, the substrate 30 may be either a solder resist printed circuit board or a leadframe.

The fabrication of the partially completed packaged deice 190 now continues with the process steps described in method 300 until the packaged device 10 is complete. Generally, the next step is wire bonding the leads 70 of the semiconductor die 20 to the substrate 30 (as described in step 360). The packaged device 10 is completed when it is encapsulated with molding compound 100 (as described in step 370 and shown in FIGS. 1 and 2).

Figure 14:
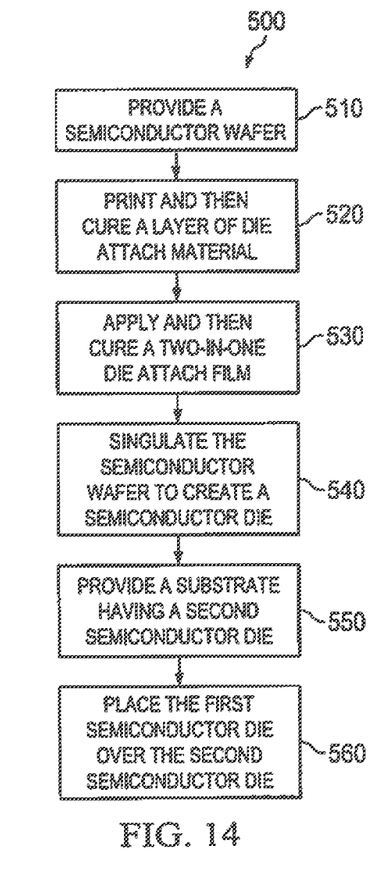
FIG. 14 is another alternative method for fabricating a packaged electronic device in accordance with the present invention.
Figure 15:
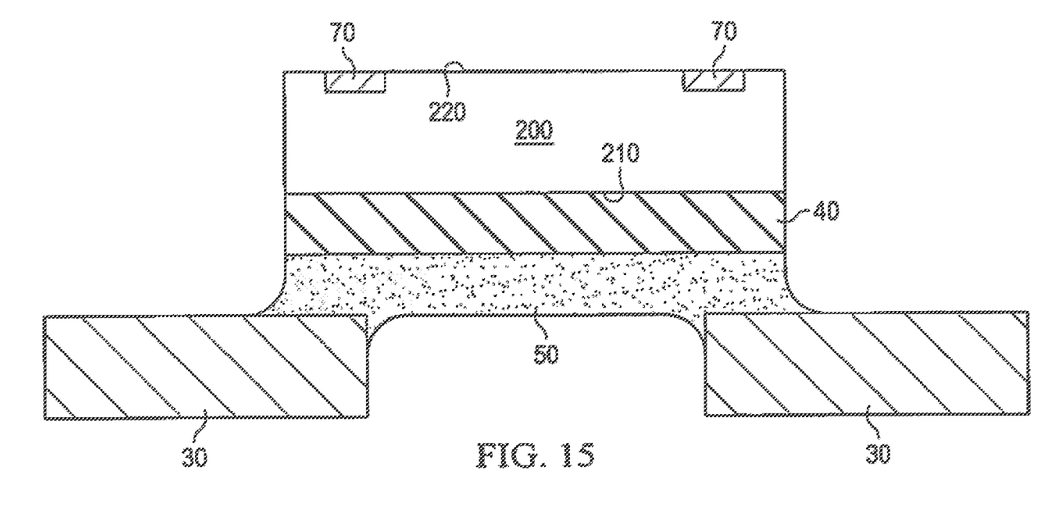
FIGS. 15-16 are cross-sectional diagrams of selected steps of the method of FIG. 14.
Figure 16:
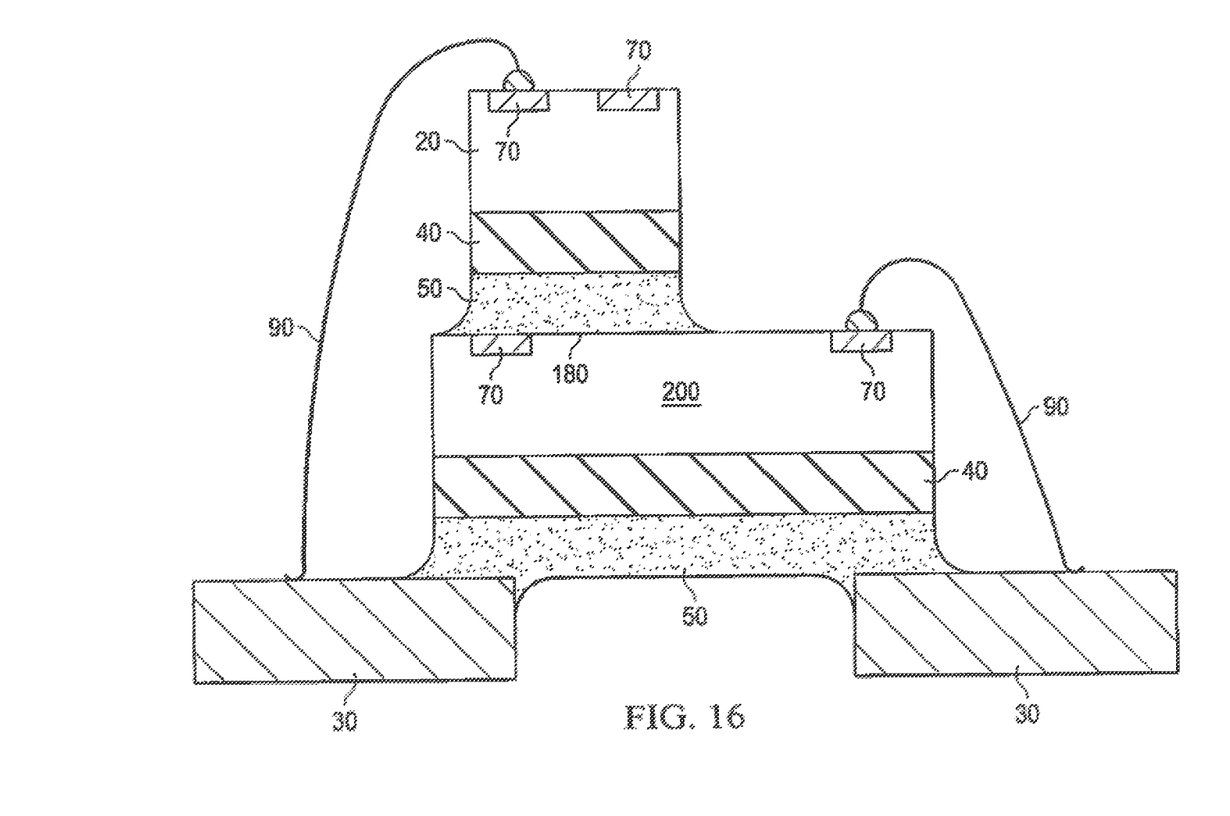

FIG. 14 shows another alternative method 500 for fabricating the partially completed packaged device 190. FIGS. 15-16 are cross-sectional views of selected steps discussed in method 500.

Method 500 begins with steps 510-540, which are similar to steps 310-340 described supra and shown in FIG. 4. Step 550 is providing a substrate 30 (which may be a solder resist printed circuit board or a leadframe) that has a second semiconductor die 200. As shown in FIG. 15, the back side 210 of the second semiconductor die 200 is attached to the substrate 30 by any suitable means (such as the die attach material 40 plus the adhesive layer 50 shown in FIG. 15). The second semiconductor die 200 has a front side 220 (containing leads 70) that is opposite to the back side 210.

In step 560, shown in FIG. 16, a robotic pick-and-place machine may be used to separate a smaller semiconductor die 20, the die attach material 40, and the adhesive layer 50 (belonging, to the layer of 2-in-1 die attachment film) from the release film 160 of the layer of 2-in-1 die attach film. The back side 180 of the adhesive layer 50 of the 2-in-1 die attach film is placed in contact with the front side 220 of the second semiconductor die 200. In this example, the die attach material 40 and the adhesive layer 50 electrically isolate the leads 70 of second semiconductor die 200 from the semiconductor die 20.

The fabrication of the partially completed packaged deice 190 now continues with the process steps described in method 300 until the packaged device 10 is complete. Generally, the next step is placing wire bonds 90 that electrically couple selected leads 70 of the second semiconductor die 200 and the leads 70 of the semiconductor die 20 to the substrate 30 (as shown in FIG. 16). The packaged device 10 is completed when it is encapsulated with molding compound 100 (as described in step 370).

Various additional modifications to the invention as described above are within the scope of the claimed invention. As an example, the back side of the semiconductor wafer may be coated with a thin layer of conductive material (such as silver or gold) before printing the die attach material over the back side of the semiconductor wafer. In addition, the wire bonds 90 may be comprised of other suitable materials such as gold. Moreover, additional processing steps may be included in the fabrication method, such as wafer taping and back grinding (both typically performed before step 320), and various forms of inspection.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for attaching a semiconductor die to a substrate, comprising:
   providing a fully processed semiconductor wafer having a front side containing leads of said semiconductor die and a back side that is opposite to said front side;
   printing a layer of die attach material over said back side of said semiconductor wafer and then curing said printed layer of die attach material;
   applying a layer of 2-in-1 die attach film over said layer of cured die attach material and then curing said 2-in-1 die attach film;
   singulating said semiconductor wafer to create said semiconductor die having a front side containing said leads of said semiconductor die and a back side containing said cured 2-in-1 die attach film; and
   attaching said semiconductor die to said substrate by placing said back side of said semiconductor die onto said substrate.

2. The method of claim 1 wherein said substrate is a leadframe.

3. The method of claim 1 wherein said substrate is a solder resist printed circuit board.

4. The method of claim 1 wherein said 2-in-1 die attach film includes a release film plus an adhesive layer that is essentially free of filler material.

5. A method for fabricating a packaged semiconductor die, comprising:
   providing a fully processed semiconductor wafer having a front side containing leads of said semiconductor die and a back side that is opposite to said front side;
   printing a layer of die attach material over said back side of said semiconductor wafer then curing said printed layer of die attach material;
   applying a layer of 2-in-1 die attach film over said layer of cured die attach material then curing said 2-in-1 die attach film;
   singulating said semiconductor wafer to create said semiconductor die having a front side containing said leads of said semiconductor die and a back side containing said cured 2-in-1 die attach film;
   placing said back side of said semiconductor die onto a substrate;

wire bonding said leads of said semiconductor die to said substrate; and encapsulating said semiconductor die, said wire bonds, said die attach material, an adhesive layer of said 2-in-1 die attach film, and portions of said substrate in molding compound.

6. The method of claim 5 wherein said substrate is a leadframe.

7. The method of claim 5 wherein said substrate is a solder resist printed circuit board.

8. The method of claim 5 wherein said 2-in-1 die attach film includes a release film plus said adhesive layer that is essentially free of filler material.

\* \* \* \* \*